(12) United States Patent
Rearick et al.

(10) Patent No.: US 6,721,920 B2
(45) Date of Patent: Apr. 13, 2004

(54) SYSTEMS AND METHODS FOR FACILITATING TESTING OF PAD DRIVERS OF INTEGRATED CIRCUITS

(75) Inventors: Jeff Rearick, Ft. Collins, CO (US); John Rohrbaugh, Ft Collins, CO (US); Shad Shepston, Firestone, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 463 days.

(21) Appl. No.: 09/878,024

(22) Filed: Jun. 7, 2001

(65) Prior Publication Data

US 2002/0188901 A1 Dec. 12, 2002

(51) Int. Cl.$^7$ .................. G06F 11/00; H03M 13/00; G06K 5/04; G11B 27/00; G11B 20/20
(52) U.S. Cl. ................. 714/815; 314/700; 314/814; 324/617
(58) Field of Search ................. 714/815, 700, 714/814; 324/617

(56) References Cited

U.S. PATENT DOCUMENTS

| | | | |
|---|---|---|---|
| 5,488,309 A | * | 1/1996 | Farwell ................. 324/617 |
| 5,675,265 A | * | 10/1997 | Yamamori ................. 327/3 |
| 5,682,392 A | | 10/1997 | Raymond et al. |
| 5,796,260 A | | 8/1998 | Agan |
| 5,977,775 A | | 11/1999 | Chandler et al. |
| 6,275,962 B1 | | 8/2001 | Fuller et al. |
| 6,298,465 B1 | * | 10/2001 | Klotchkov ................. 714/814 |
| 6,324,485 B1 | | 11/2001 | Ellis |
| 6,356,096 B2 | * | 3/2002 | Takagi et al. ................. 324/765 |
| 6,365,859 B1 | | 4/2002 | Yi et al. |
| 6,396,279 B1 | | 5/2002 | Gruenert |
| 6,397,361 B1 | | 5/2002 | Saitoh |
| 6,609,077 B1 | * | 8/2003 | Brown et al. ................. 702/117 |

OTHER PUBLICATIONS

Haulin, Tord, "Built–in Parametric Test for Controlled Impedance I/Os," Ericsson Telecom, S–126 25 Stockholm, Sweden, pp. 123–128.

Niggemeyer, M. Ruffer, "Parametric Built–In Self Test of VLSI Systems," Laboratory for Information Technology, University of Hannover, Germany.

* cited by examiner

Primary Examiner—Albert Decady
Assistant Examiner—Joseph D. Torres

(57) ABSTRACT

A preferred integrated circuit (IC) includes a first pad electrically communicating with at least a portion of the IC. The first pad includes a first driver and a first receiver, with the first driver being configured to provide a first pad output signal to a component external to the IC, and the first receiver being configured to receive a first pad input signal from a component external to the IC. The first receiver also is configured to provide, to a component internal to the IC, a first receiver digital output signal in response to the first pad input signal. A first test circuit also is provided that is internal to the IC. The first test circuit is adapted to provide information corresponding to the driver clock-to-q time of the first pad. Systems, methods and computer-readable media also are provided.

10 Claims, 16 Drawing Sheets

SYSTEMS AND METHODS FOR FACILITATING TESTING OF PAD DRIVERS OF INTEGRATED CIRCUITS

BACKGROUND OF THE INVENTION

1. Field of the Invention

The present invention generally relates to integrated circuits and, in particular, to systems and methods for facilitating, within an integrated circuit, driver clock-to-output delay testing of pads of the integrated circuit.

2. Description of the Related Art

Heretofore, integrated circuit (IC) devices have been tested and verified using a variety of test methods. For example, IC devices have been tested and verified to be defect-free using functional test vectors, such as those applied to the IC by the use of automated test equipment (ATE), which stimulate and verify the IC device functionality at the pin level of the device. A practical limitation to the utilization of ATE for testing IC's, however, is that the number of IC pins (or pads) that can be tested by a particular ATE has, heretofore, been limited by the physical configuration of the ATE. For instance, the number of pads of the IC to be tested may exceed the number of test channels provided by an ATE, or the number of pads may exceed the capacity of the ATE support hardware, such as by exceeding the maximum number of probes on a probe card, among others. As utilized herein, the term "pad" is used to refer collectively to both a physical site, which serves as an electrical contact for an IC, as well as circuitry associated with the physical site for enabling electrical communication between components of the IC and components external to the IC.

Additionally, performance limitations of a particular ATE may impose certain other testing restrictions. For example, the frequency of IC inputs and outputs may exceed the maximum frequency of the ATE, thereby limiting the test frequency of the IC to be tested to the maximum frequency of the ATE. Although configuring an ATE with additional test channels and/or a higher operating frequency may be accomplished, providing an ATE with an appropriately high pin count and/or an appropriately high operating frequency in order to eliminate the aforementioned deficiencies is, oftentimes, cost prohibitive.

In light of the foregoing and other deficiencies, it is known in the prior art to test IC devices utilizing a variety of "stop-gap" testing procedures, including: (1) connecting an ATE to less than all of the pins of an IC device; (2) connecting multiple pins of an IC device to a single ATE test channel; (3) testing the IC device in multiple passes of the ATE, with each pass testing a subset of the pins of the entire IC device; (4) testing the device at less than maximum frequency, and; (5) limiting, through design implementation, the pin count and/or frequency of the IC device to accommodate existing ATE, among others. As should be readily apparent, many of these "stop-gap" testing procedures may result in a loss of test coverage and, thereby, may lead to an increase in numbers of defective IC devices being shipped. Moreover, the practice of limiting, through design implementation, the pin count and/or frequency of the IC device to accommodate existing ATE is, oftentimes, an unacceptable constraint on IC design.

Referring now to FIG. 1, a representative prior art integrated circuit 100 incorporating built-in self-test circuitry will be described in greater detail. As shown in FIG. 1, integrated circuit 100 includes a core 110 which incorporates logic 112 and digital self-test circuitry 114. Core 110 electrically communicates with pad 116 which is configured to electrically communicate with devices external to the integrated circuit, such as a piece of automated test equipment (ATE) 118, for example. So configured, signals provided from an external device, e.g., ATE 118, may be delivered to the core 110 via a transmission path which includes pad 116.

As is known, digital self-test circuitry 114 is configured to provide functional-based digital testing of logic circuitry contained within core 110. In order to accomplish such testing, digital self-test circuitry 114 typically incorporates a stimulus generator 120 and a response analyzer 122. More specifically, stimulus generator 120 is configured to provide one or more test patterns for testing logic circuitry of the core. The pattern or patterns provided to the logic circuitry are comprised of digital data, i.e., zeros and ones. In response to the various patterns, the logic circuitry under test then provides a response signal or signals to the response analyzer 122 which is able to interpret the response and provide a test result signal, which may be provided externally of the integrated circuit. Thus, the digital self-test circuitry provides for digital, functional testing of the core by applying digital test patterns to the logic circuitry of the core and has, heretofore, substantially removed the need for external test equipment, i.e., ATE 118, to provide stimulus to and check responses from the integrated circuit for facilitating testing of the digital logic circuitry.

Digital self-test circuitry, however, is largely unable to remedy the foregoing and/or other deficiencies. Therefore, there is a need for improved systems and methods which address the aforementioned and/or other shortcomings of the prior art.

SUMMARY OF THE INVENTION

Briefly described, the present invention provides driver clock-to-output (henceforth called "clock-to-q") testing functionality within integrated circuits. In this regard, some embodiments of the present invention may be construed as providing integrated circuits (IC's). In a preferred embodiment, the integrated circuit includes a first pad electrically communicating with at least a portion of the IC. The first pad includes a first driver and a first receiver, with the first driver being configured to provide a first pad output signal to a component external to the IC, and the first receiver being configured to receive a first pad input signal from a component external to the IC. The first receiver also is configured to provide, to a component internal to the IC, a first receiver digital output signal in response to the first pad input signal. A first test circuit also is provided that is internal to the IC. The first test circuit is adapted to provide information corresponding to the driver clock-to-q time of the first pad.

Some embodiments of the present invention may be construed as providing systems for measuring the driver clock-to-q times of pads of an integrated circuit. In this regard, a preferred system includes an IC and ATE. The ATE is configured to electrically interconnect with the IC and to provide at least one stimulus to the IC. The IC includes a first pad that incorporates a first driver, a first receiver, and a first test circuit. So configured, the first test circuit may electrically communicate with the ATE so that, in response to receiving at least one stimulus from the ATE, the first test circuit provides information corresponding to the driver clock-to-q time of at least one of the pads to the ATE.

Some embodiments of the present invention may be construed as providing methods for testing an IC. In this regard, a preferred method includes the steps of: electrically interconnecting ATE with the IC; providing at least one stimulus such that the IC measures the driver clock-to-q time of the first pad; and receiving information corresponding to the driver clock-to-q time of the first pad.

Other embodiments of the present invention may be construed as providing computer-readable media. In this regard, a preferred computer readable medium, which incorporates a computer program for facilitating measuring of the driver clock-to-q times of pads of an IC includes logic configured to enable ATE to provide at least one stimulus to the IC. Additionally, logic configured to enable the ATE to receive information corresponding to the driver clock-to-q time of at least one of the pads of the IC is provided.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION OF A PREFERRED EMBODIMENT

Figure 1:
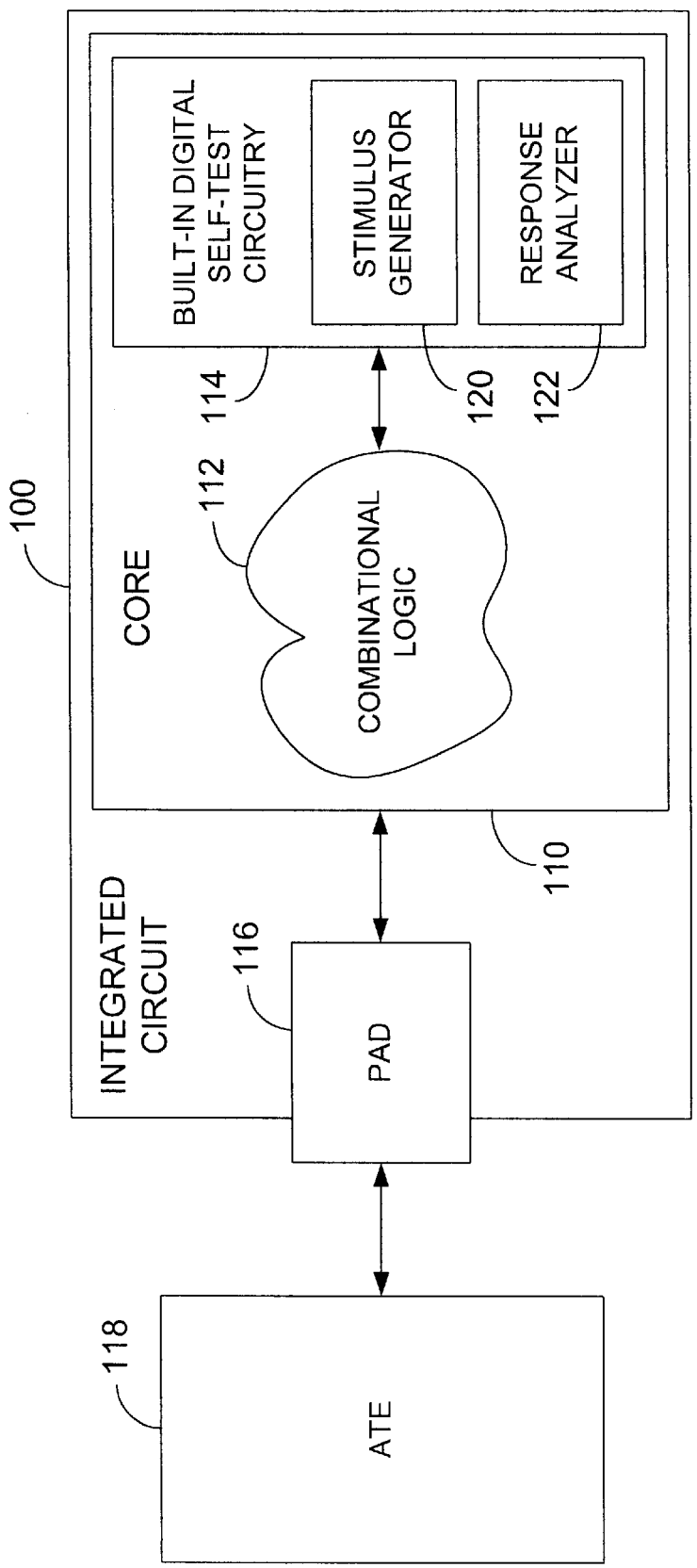
FIG. 1 is a schematic diagram depicting a representative integrated circuit incorporating digital self-test circuitry of the prior art.

Reference will now be made in detail to the description of the invention as illustrated in the drawings with like numerals indicating like parts throughout the several views.

Figure 2:
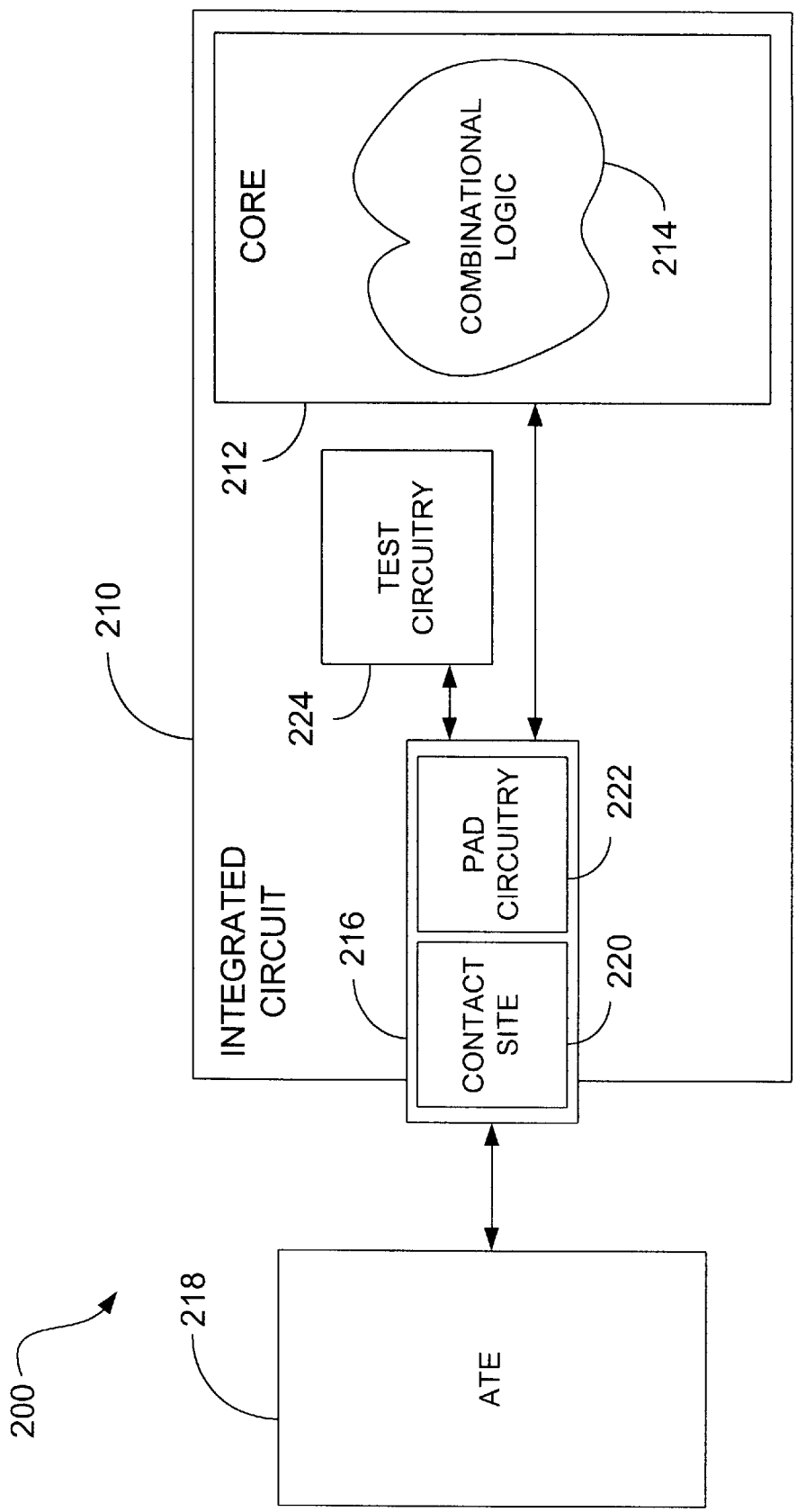
FIG. 2 is a schematic diagram depicting a preferred embodiment of the test circuitry of the present invention.

Utilizing the digital self-test circuitry of FIG. 1 as a point of comparison, general characteristics of a preferred embodiment of the test system of the present invention will now be described in reference to the schematic diagram of FIG. 2. As depicted in FIG. 2, test system 200 incorporates an integrated circuit 210 which includes a core 212. Core 212 incorporates logic 214 and electrically communicates with a pad 216, which is configured to allow intercommunication of the logic with devices, such as ATE 218, for example, external to the integrated circuit. As mentioned hereinbefore, a pad, such as pad 216, includes a physical or contact site 220, which serves as an electrical contact for IC 210, as well as pad circuitry 222, which cooperates with the contact site to enable electrical communication between components of the IC and components external to the IC. As is known, pad circuitry may include one or more of a receiver, for receiving signals provided to the pad, and a driver, for providing signals to external devices.

Additionally, integrated circuit 210 incorporates test circuitry 224 which electrically communicates, either directly or indirectly, with pad 216. As described in detail hereinafter, test circuitry 224 is configured to provide selected ATE functionality and, thereby, potentially reduces the necessity for specialized external automated test equipment for testing integrated circuits of various configurations. It should be noted that, although test circuitry 224 is depicted in FIG. 2 as residing outside core 212 and outside the pad 216, various other arrangements of test circuitry 224 may be utilized, such as test circuitry arranged within the core or within the pad, for instance. Moreover, the test circuitry may be configured to communicate with the ATE via a pad other than the pad to be tested, i.e., a pad other than pad 216.

As mentioned hereinbefore, ATE typically provides the ability to test a wide variety of integrated circuits. Oftentimes, however, the full testing capability of a given ATE is usually not required to test a specific type of integrated circuit. Additionally, the number of pads of an integrated circuit may exceed the number of test channels of a given ATE, thereby necessitating the use of an ATE with an increased number of tester channels or necessitating the use of less than optimal testing procedures, e.g., testing fewer than all of the pads of an integrated circuit simultaneously, for instance.

By providing test circuitry "on-chip," testing of integrated circuits, such as integrated circuit 210, may be performed utilizing conventional ATE, whereby test capability not typically provided by the conventional ATE may be provided by the test circuitry. So provided, the test circuitry has the ability to provide testing capability that a given ATE does not provide, or is not able to provide, while utilizing various capabilities that a given ATE does provide. Thus, the testing system 200 of the present invention may facilitate efficient and effective testing of integrated circuits that draws from at least some of the inherent strengths of conventional ATE, e.g., accurate voltage, current, and time measurement capability and reduced costs, while providing potentially improved testing performance.

By utilizing test circuitry of the present invention, testable pin count of an integrated circuit is not necessarily limited by the ATE, such as by the tester channel configuration of a given ATE. For instance, the ATE may provide signals, such as scan test signals and resets, for example, to some pads of an integrated circuit under test, while leaving other pads to be tested by the internal test circuitry. Additionally, utilization of this test circuitry makes it possible to test the integrated circuits at frequencies greater than the test frequency limit of the ATE.

As mentioned hereinbefore, the present invention facilitates driver clock-to-q ($T_{ck\_q}$) delay testing of pads of integrated circuits and, in preferred embodiments, facilitates such testing, at least in part, with the use of "on-chip" components. As utilized herein, the terms "clock-to-output" and/or "clock-to-q" refer to the time delay between receipt of a clock edge and a corresponding change in the output signal ("q") of a component. For the purpose of describing test circuitry of the present invention, the terms "clock-to-output," "clock-to-q," and/or "$T_{ck\_q}$" will, most often, be used in regard to a driver(s) of an IC.

Figure 3:
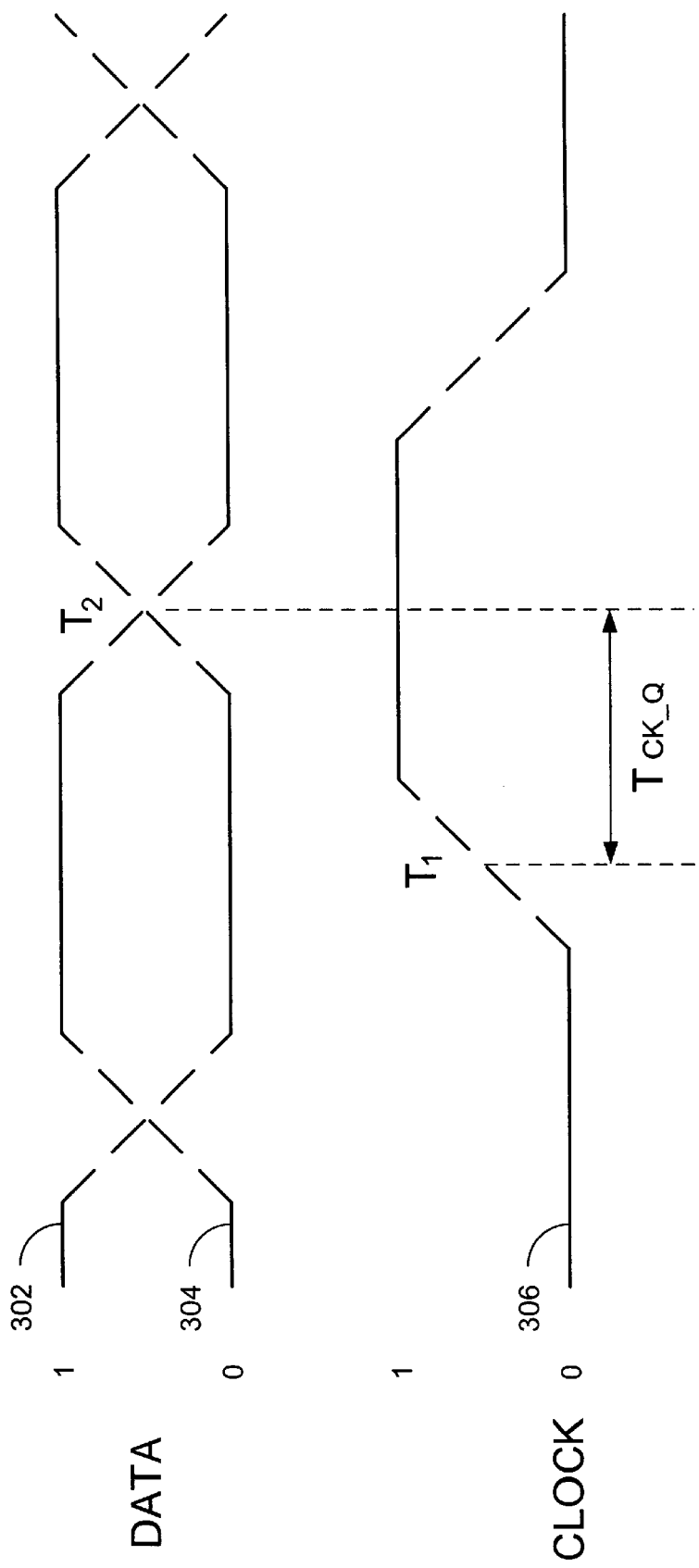
FIG. 3 is a timing diagram depicting a representative driver clock-to-output ($T_{ck\_q}$) delay.

A graphical depiction of $T_{ck\_q}$ is presented in FIG. 3, wherein representative data signals 302 and 304 are shown transitioning between logic "0" and logic "1." A clock signal 306 also is depicted, with $T_{ck\_q}$ being denoted in relation to the clock and data signals. It should be noted that $T_{ck\_q}$ is measured from $T_1$ to $T_2$, i.e., $T_1$ being where the clock edge is rising (for positive edge-triggered components; falling for negative edge-triggered components) and has been received by a component, and $T_2$ being where the data has transitioned from a first logic value to a valid second logic value. The exact analog voltage value that distinguishes the first valid logic value from the second valid logic value is design-dependent, but is chosen here to be at the 50% point.

Figure 4:
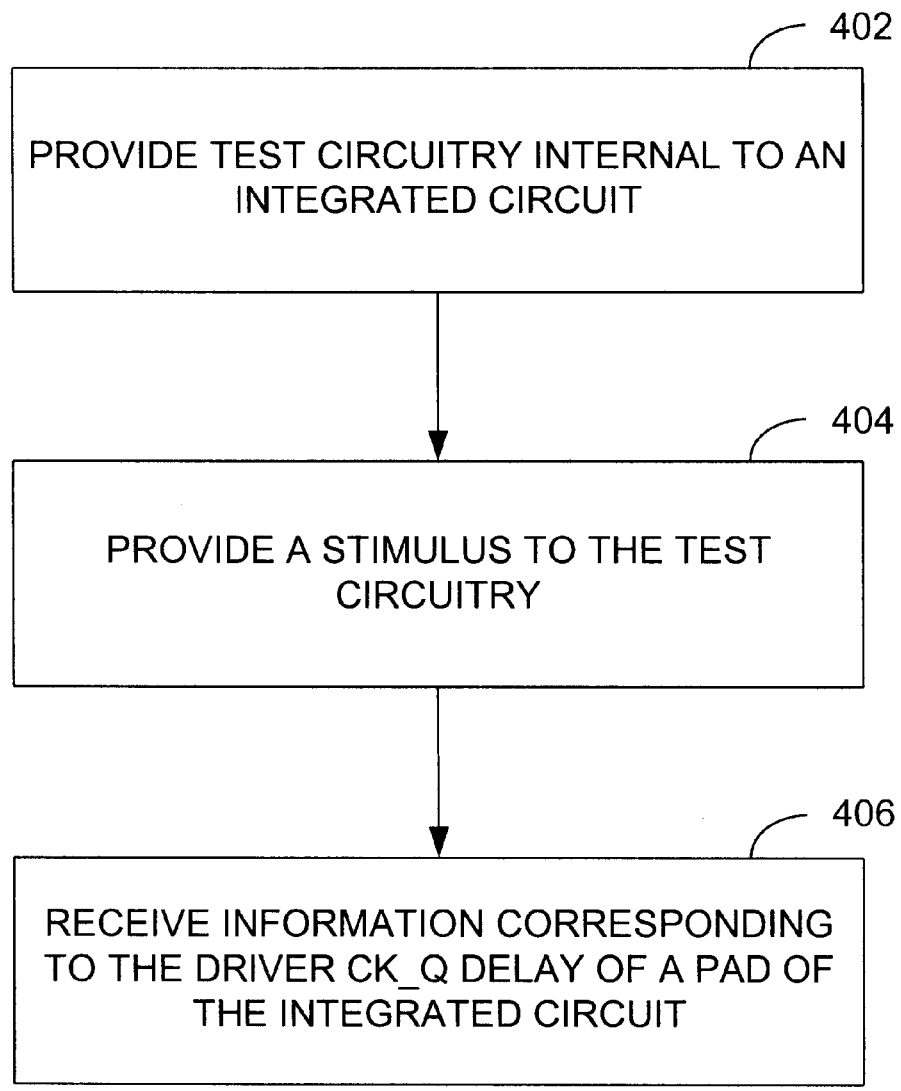
FIG. 4 is a flowchart depicting preferred functionality of the embodiment of FIG. 2.

Reference will now be made to FIG. 4, which is a flowchart depicting the functionality of a preferred implementation of the present invention. In this regard, the functions noted in the various blocks may occur out of the order depicted in FIG. 4 (or in flowcharts of other figures depicted herein). For example, two blocks shown in succession in FIG. 4 may, in fact, occur substantially concurrently or, in some embodiments, in the reverse order.

As shown in FIG. 4, the embodiment or method depicted may be construed as beginning at block 402 where test circuitry is provided internal to an integrated circuit. In block 404, a stimulus is provided to the test circuitry. Thereafter, such as depicted in block 406, information corresponding to the driver clock-to-q delay of a pad of the integrated circuit is received.

Figure 5:
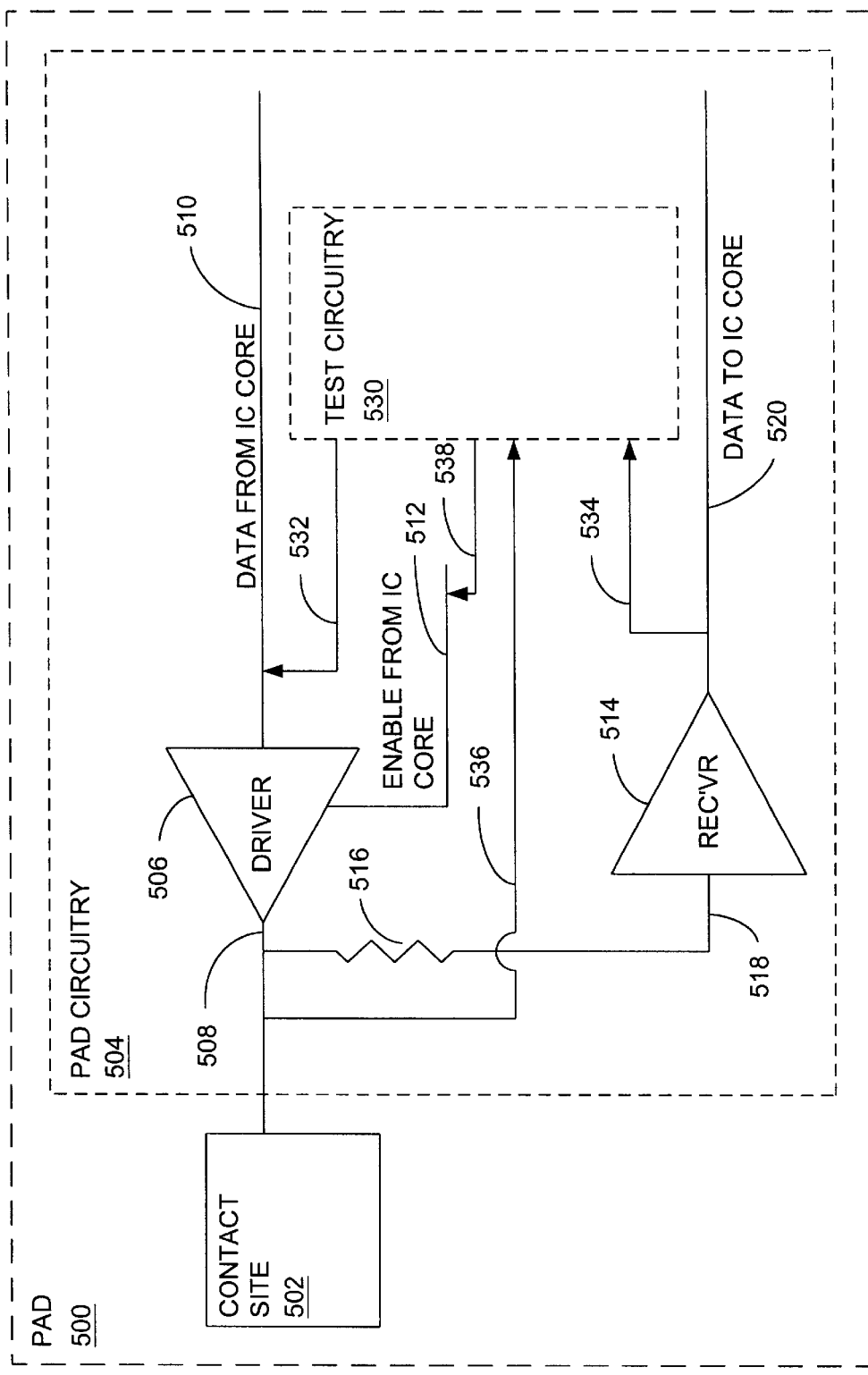
FIG. 5 is a schematic diagram depicting a preferred embodiment of the test circuit of FIG. 2.

In FIG. 5, a preferred embodiment of the test circuit of the invention is presented. As shown in FIG. 5, a pad 500 of an integrated circuit includes both a contact site, e.g., contact site 502, and pad circuitry associated with the contact site, e.g., pad circuitry 504. Circuitry 504 includes a driver 506 that electrically communicates with the contact site 502, such as by lead 508. Driver 506 is configured to receive a data signal 510 from the IC core and a driver enable signal 512 from the IC core. Driver 506 also is electrically interconnected to a receiver 514 with an optional resistor 516 being coupled therebetween. Receiver 514 is configured to receive an input, such as via lead 518, and is configured to provide an output, such as via lead 520, to the IC core of the integrated circuit.

FIG. 5 also depicts a preferred embodiment of test circuitry 530. More specifically, test circuitry 530 may be configured to communicate with one or more of the driver input (depicted by arrow 532), the receiver output (depicted by arrow 534), the driver output (depicted by arrow 536), and the driver enable (depicted by arrow 538). Test circuitry 530 is configured to facilitate determining the driver clock-to-q time by utilizing one or more of the aforementioned input(s)/output(s).

Figure 6:
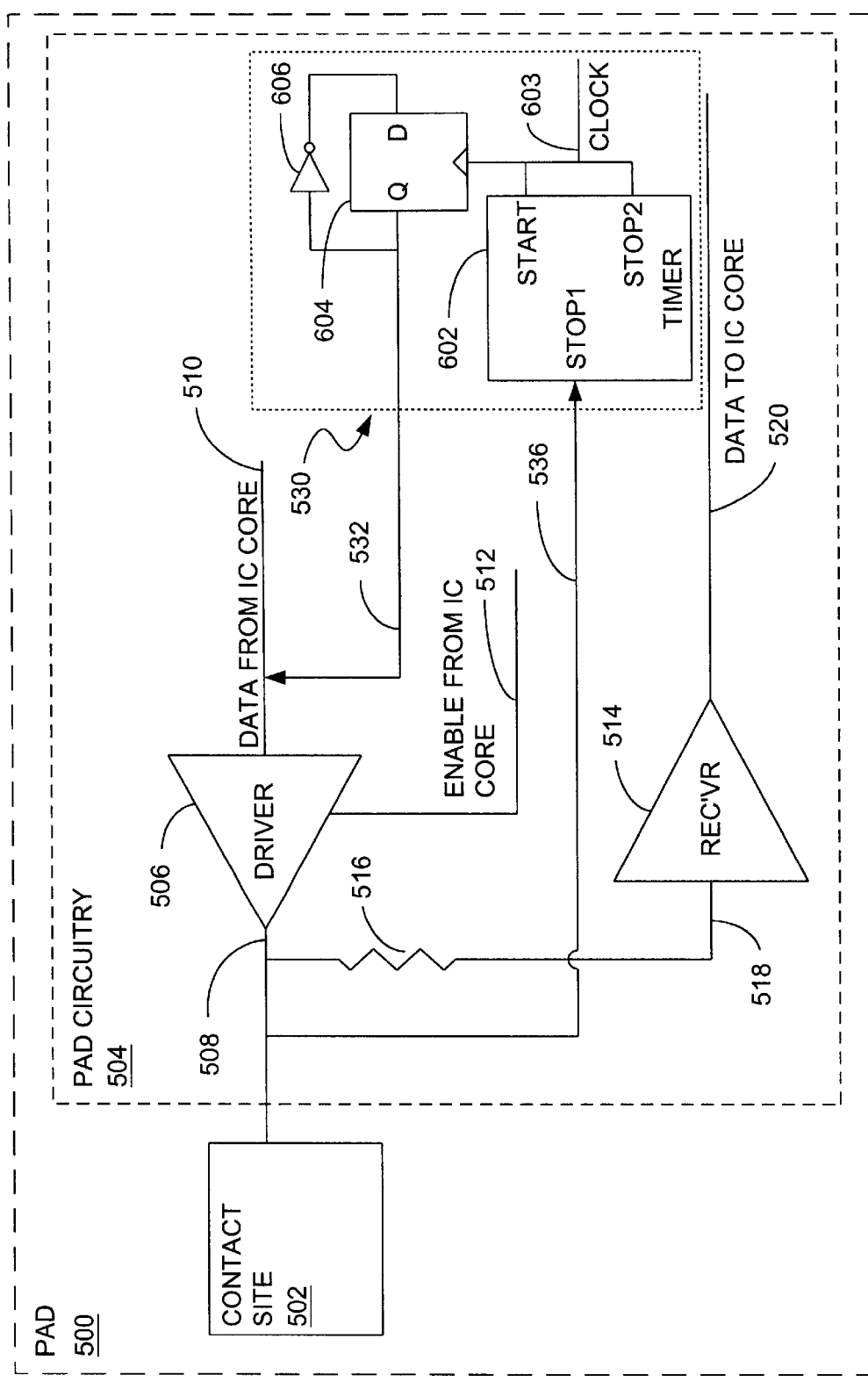
FIG. 6 is a schematic diagram of the embodiment shown in FIG. 5, depicting detail of a preferred circuit implementation.

Referring now to FIG. 6, a preferred embodiment of test circuitry 530 will be described in greater detail. As depicted in FIG. 6, a preferred embodiment of test circuitry 530 includes a timer 602. Preferably, timer 602 is a high-speed time interval counting circuit that incorporates a ring oscillator and a digital counter (both not shown). Timer 602 is adapted to count the number of oscillations that occur between a start event and a stop event. So provided, the interval between a rising edge of a clock signal 603 (a start event) and a change of state of a corresponding pad (a stop event) can be measured. Additionally, test circuitry 530 includes a flip-flop 604 and an associated inverter 606 that is adapted to self invert the data of the flip-flop so that a rising edge of the clock will cause a transition on the q output of the flip-flop. As depicted in FIG. 6, the q output is provided to driver 506 via path 532.

Since the exact period of a high-frequency ring oscillator typically is unknown and potentially subject to variation from process drift as well as voltage and temperature fluctuations, the test circuitry preferably accounts for these potential variations. This may be accomplished by calibrating the interval measured by the timer in reference to a signal of known interval. In this manner, the interval measured by the timer may be expressed as a percentage of the reference interval so that the measured interval may be determined with a relatively high degree of accuracy.

Figure 7:
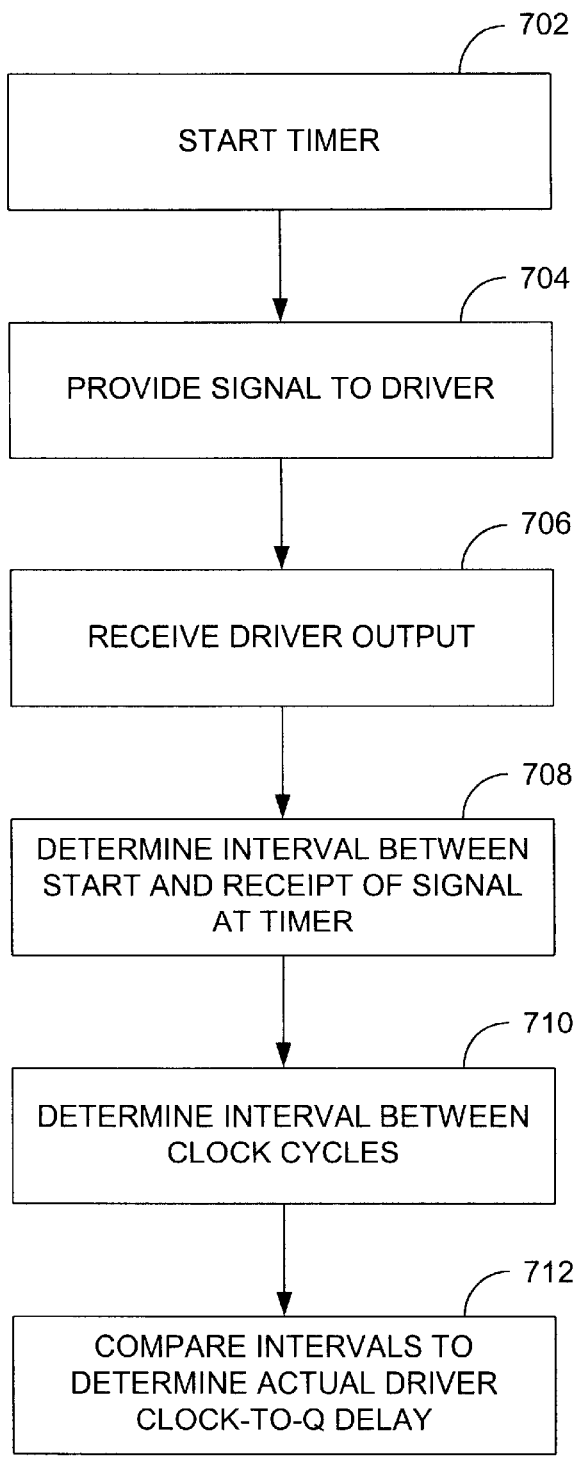
FIG. 7 is a flowchart depicting the preferred functionality of the embodiment of FIG. 6.

Operation of the embodiment depicted in FIG. 6 will now be described in relation to the flowchart of FIG. 7. In this regard, the method depicted in FIG. 7 may be construed as beginning at block 702 where the timer (e.g., timer 602 of FIG. 6) is started. Concurrently therewith, a signal is provided to the driver as depicted in block 704. Thereafter, a driver output corresponding to the provided signal is received (block 706). In block 708, the interval between the start of the timer and receipt of the driver signal at the timer is determined by counting the number of high-frequency ring oscillator periods elapsed. Similarly, but in a separate measurement event, such as depicted in block 710, the interval in terms of oscillator periods between two successive clock cycles is determined. In block 712, these aforementioned intervals are compared in order to determine the actual driver clock-to-q delay, since the period (measured in units of seconds) of the clock is a precisely known quantity (since it is produced by the ATE). For instance, the interval between start of the timer and receipt by the timer of the driver output can be divided by the clock period. Thus, the determined interval is expressed as a percentage of the known clock period.

Alternative embodiments of test circuitry of the present invention may determine driver clock-to-q by determining the "roundtrip time" and extracting from that time the driver clock-to-q delay. More specifically, the "roundtrip time" refers to the cumulative time taken to drive data from a launching flip-flop, through a driver to a pad, and then from the pad through a receiver into a capturing flip-flop. The relationships between roundtrip time ($T_{ROUNDTRIP}$), driver clock-to-q ($T_{CK\_Q}$), receiver set-up ($T_{SETUP}$), and receiver hold ($T_{HOLD}$) times are depicted in the timing diagram of FIG. 8, which will be described in detail hereinafter.

Figure 9:
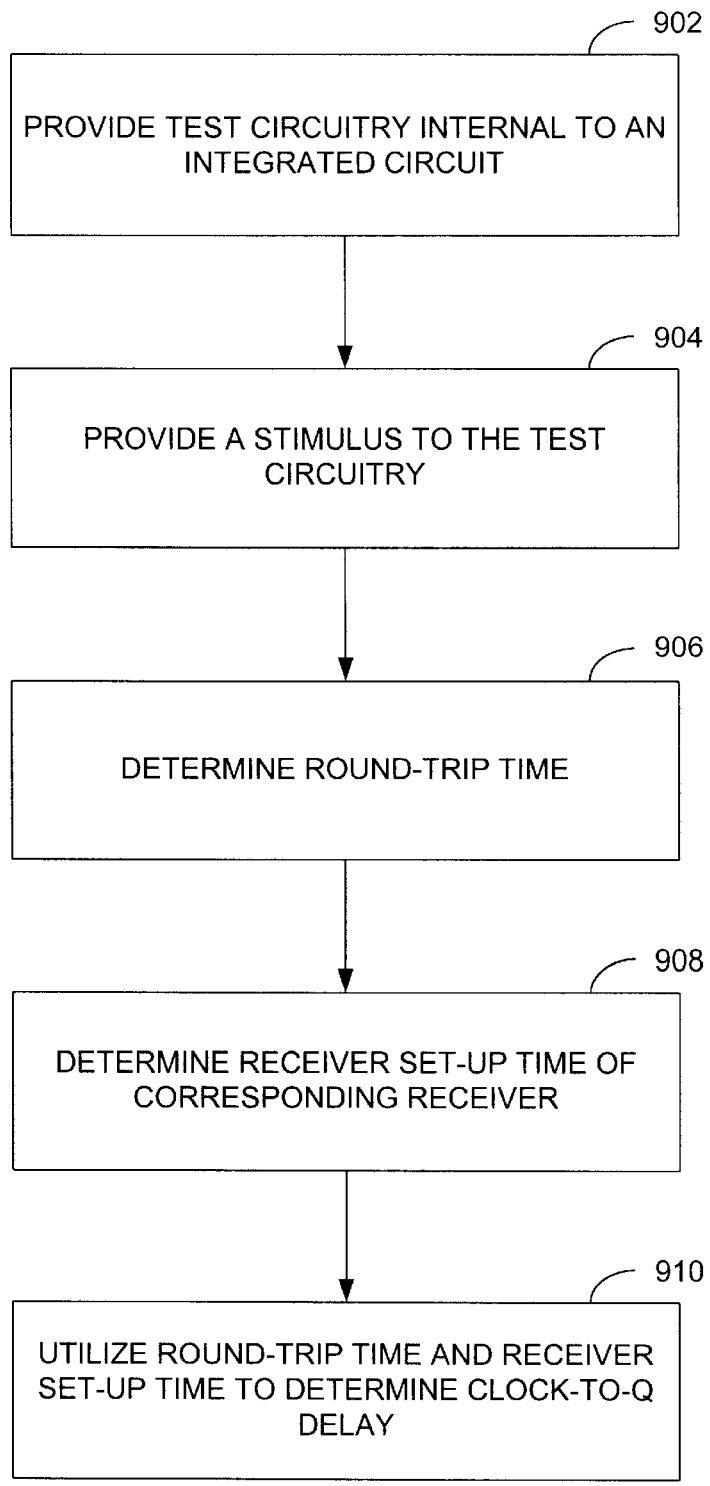
FIG. 9 is a flowchart depicting functionality of an alternative embodiment of the test circuit of FIG. 2.

A representative method for accomplishing the aforementioned functionality is depicted in FIG. 9. In FIG. 9, the method may be construed as beginning at block 902 where test circuitry is provided internal to an integrated circuit. In block 904 a stimulus is provided to the test circuitry. Thereafter, such as depicted in block 906, roundtrip time of a pad is determined. In block 908 the receiver set-up time corresponding to the receiver of the pad is determined. Additionally, in block 910, the roundtrip time and receiver set-up time are utilized to determine the clock-to-q delay.

Several alternative embodiments of the test circuitry of the invention, which may be utilized to determine receiver setup times of pads of an IC, will now be described in detail. Co-pending U.S. patent application Ser. No. 10/094,528, filed on Mar. 8, 2002, which is commonly assigned to Agilent Technologies, also describes several of these alternative embodiments. That application is incorporated by reference herein in its entirety.

Figure 10:
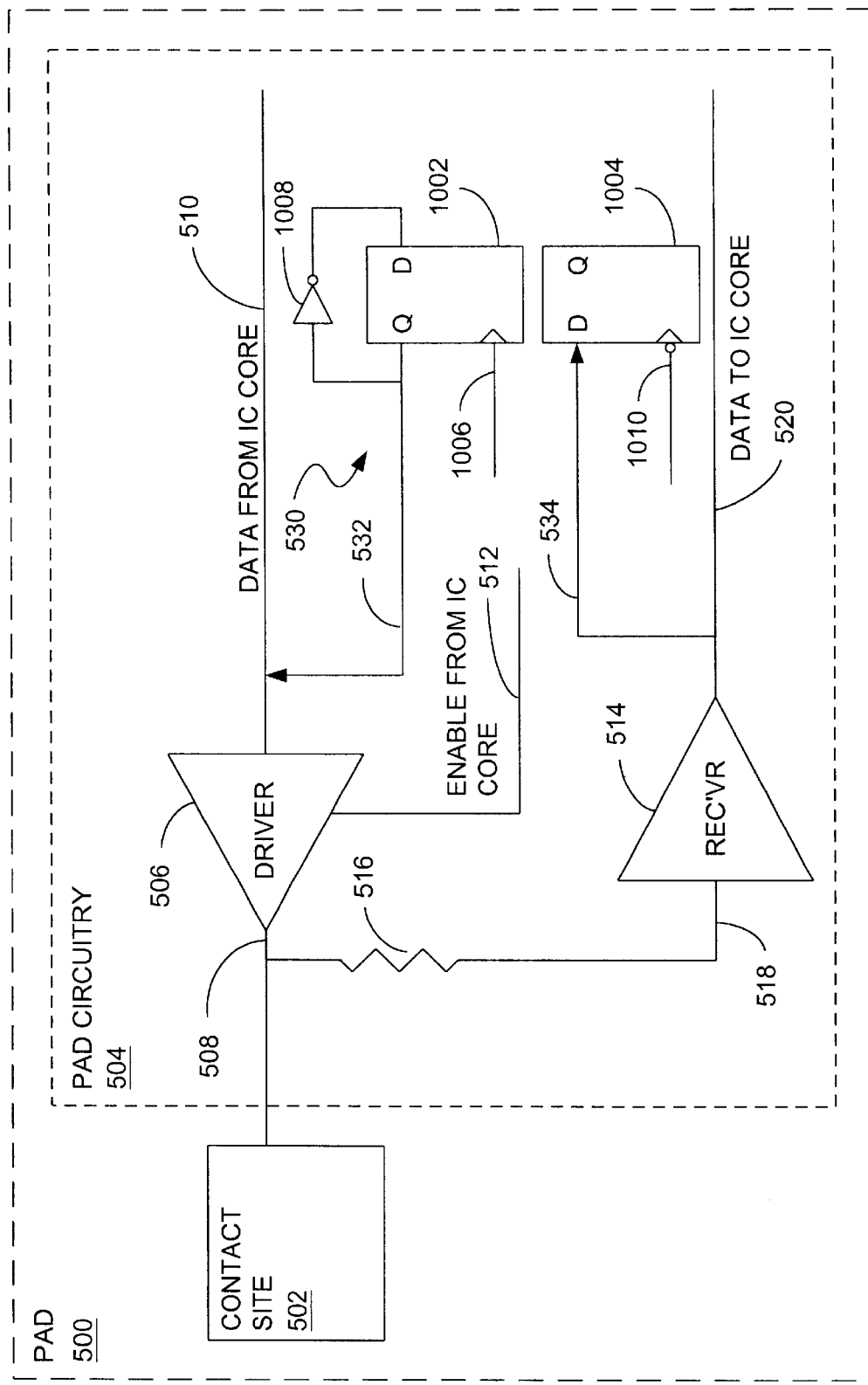
FIG. 10 is a schematic diagram of the embodiment shown in FIG. 5, depicting detail of an alternative circuit implementation.

Referring now to FIG. 10, an alternative embodiment of test circuitry 530 includes a launch flip-flop 1002 and a capture flip-flop 1004. Launch flip-flop 1002 is adapted to receive a clock signal 1006 and, in response thereto, provide an inverted data signal to the input of driver 506. For example, the Q output of flip-flop 1002 is provided to inverter 1008. Thus, the rising edge of the launch clock signal causes a transition on the Q output of the launch flip-flop.

Capture flip-flop 1004 electrically communicates with the output of receiver 514. Preferably, capture flip-flop 1004 is negative-edge triggered (see input 1010), so that a falling edge of the clock enables the capture flip-flop 1004 to capture the output data signal of the receiver 514.

Figure 8:
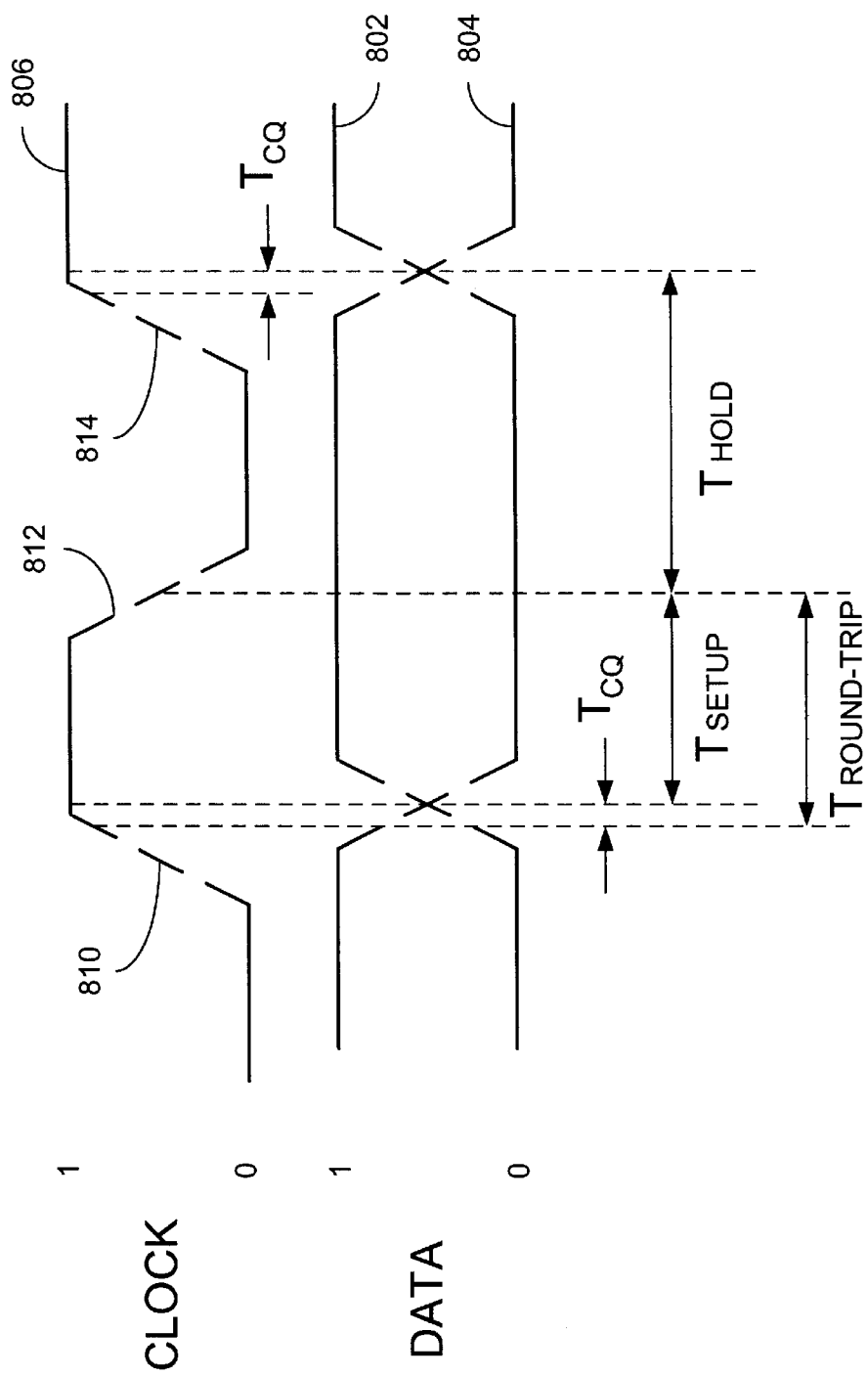
FIG. 8 is a timing diagram depicting representative relationships of roundtrip time, receiver setup time, and driver clock-to-q time.

Operation of the embodiment depicted in FIG. 10 will now be described in relation to the timing diagram of FIG. 8, which depicts representative data signals 802 and 804, and clock signal 806 (which acts as both a launch and capture clock). As shown in FIG. 8, the first rising edge 810 of the clock causes a transition of the data (the launch event). Thereafter, the falling edge 812 of the clock enables the data to be captured. By analyzing the time difference between the rising edge 810 and the falling edge 812 (in relation to the data signal), $T_{setup}$ may be determined. Subsequently, second rising edge 814 of the clock causes another transition of the data. Thereafter, $T_{setup}$ may be utilized with $T_{ROUNDTRIP}$ to determine $T_{CK\_Q}$. It should be noted that the time difference between the falling edge 812 and the rising edge 814 may be utilized to determine $T_{hold}$.

Figure 11:
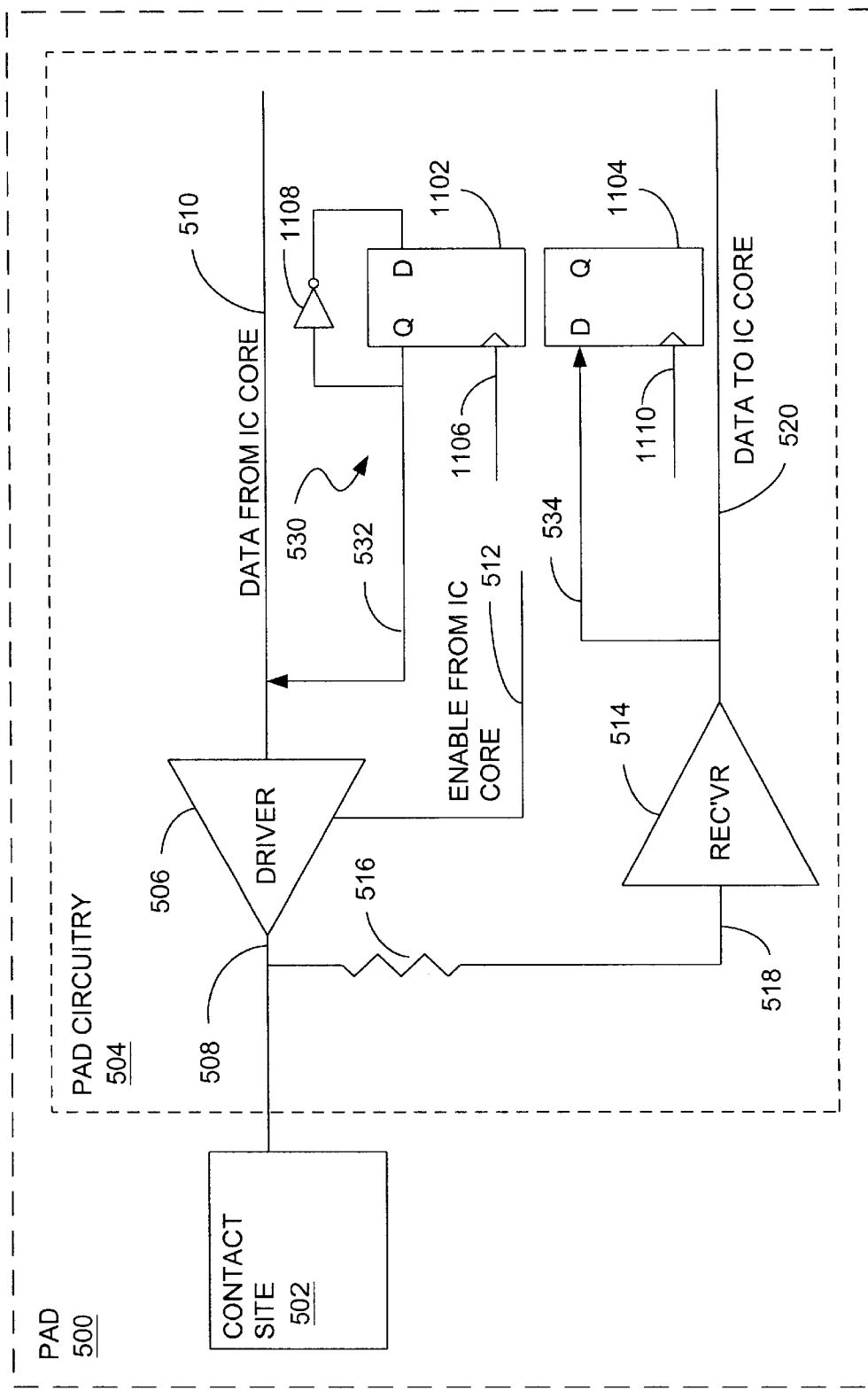
FIG. 11 is a schematic diagram of the embodiment shown in FIG. 5, depicting detail of an alternative circuit implementation.

An alternative embodiment of test circuitry 530 is depicted in FIG. 11. As shown therein, test circuitry 530 includes a launch flip-flop 1102 and a capture flip-flop 1104. Launch flip-flop 1102 is adapted to receive a launch clock signal 1106 and, in response thereto, provide an inverted data signal to the input of driver 506. For example, the Q output of flip-flop 1102 is provided to inverter 1108. Thus, the rising edge of the launch clock signal causes a transition on the Q output of the launch flip-flop.

Capture flip-flop 1104 electrically communicates with the output of receiver 514. Capture flip-flop 1104 is adapted to receive a capture clock signal 1110 and, in response thereto, capture the output data signal 534 of the receiver 514. Firing of the launch and capture clocks may be controlled by an internal timing generator, an external tester or other appropriate device(s) (not depicted in FIG. 11), provided that time differences between the clocks are known and/or are controllable.

Figure 12:
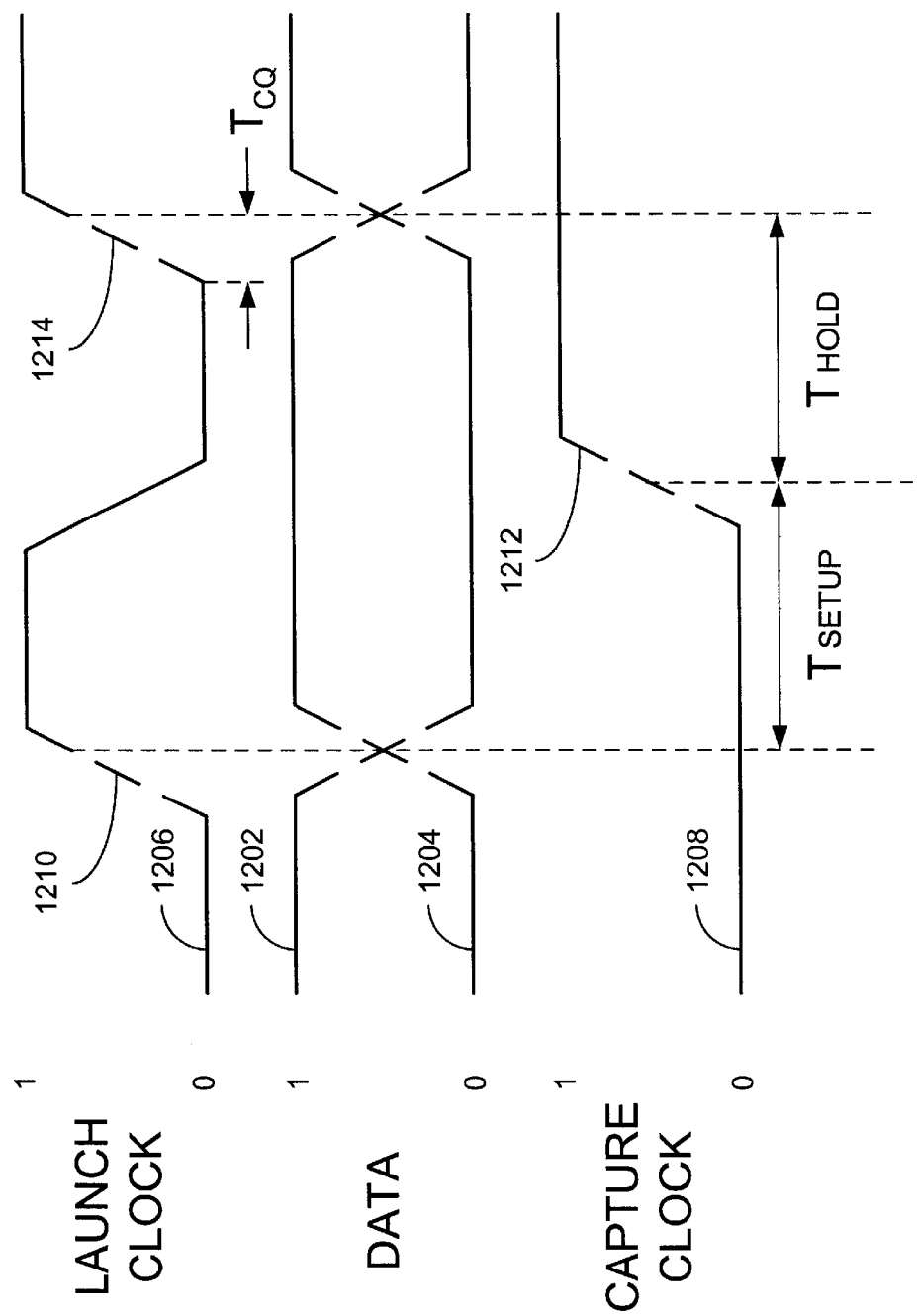
FIG. 12 is a timing diagram depicting functionality of the embodiment shown in FIG. 11.

Operation of the embodiment depicted in FIG. 11 will now be described in relation to the timing diagram of FIG. 12, which depicts representative data signals 1202 and 1204, launch clock signal 1206, and capture clock signal 1208. As shown in FIG. 12, the first rising edge 1210 of the launch clock causes a transition of the data. The capture clock then is fired, e.g., rising edge 1212 of the capture clock is provided. By analyzing the time difference between the rising edge 1210 and the rising edge 1212 (in relation to the data signal), $T_{setup}$ may be determined. It should be noted that the time difference between the rising edge 1212 and the second rising edge 1214 may be utilized to determine $T_{hold}$. The embodiments of FIGS. 10 and 11 each may be utilized by establishing an initial value for $T_{setup}$, e.g., $XT_{setup}$. More specifically, $XT_{setup}$ corresponds to a variable time period for applying a signal to a pad receiver under test. The time period of $XT_{setup}$ is utilized for determining the actual $T_{setup}$ of the pad receiver.

By way of example, the receiver may be provided with an input data signal ($DATA_{IN}$), i.e., a logic "0" or a logic "1," for a time period of $XT_{setup}$ prior to and continuing through a period $XT_{hold}$ after firing of a capture clock. After determining an output data signal of the receiver ($DATA_{OUT}$) corresponding to $DATA_{IN}$, a determination may be made as to whether $DATA_{OUT}$ is equal to $DATA_{IN}$. For example, if $DATA_{IN}$ is a logic "1," a determination is made as to whether $DATA_{OUT}$ is a logic "1." If it is determined that $DATA_{IN}$ is not equal to $DATA_{OUT}$, $XT_{setup}$ may be set to a different value than that previously established. The process may the be recursively applied until $DATA_{IN}$ equals $DATA_{OUT}$. Thus $T_{setup}$ corresponds to the value of $XT_{setup}$ resulting in $DATA_{IN} = DATA_{OUT}$. $T_{setup}$ may then be subtracted from $T_{ROUNDTRIP}$ to determine $T_{CK\_Q}$.

The aforementioned utilization of $XT_{setup}$ assumes that the initial value for $XT_{setup}$ results in a $DATA_{IN}$ that is not equal to $DATA_{OUT}$. It should be noted that an initial value for $XT_{setup}$ may be utilized that results in a $DATA_{IN}$ that is equal to $DATA_{OUT}$. In these embodiments, $XT_{hold}$ may be held constant while adjusting $XT_{setup}$ until $DATA_{IN}$ does not equal $DATA_{OUT}$. Thus, $T_{setup}$ would correspond to the value of $XT_{setup}$ resulting in $DATA_{IN} \neq DATA_{OUT}$.

In some embodiments, the clock-to-q component of a roundtrip time measurement may be determined with the use of a reference pad of an identical circuit type. In these embodiments, the reference pad is to be contacted by the ATE. Thereafter, the ATE clock pulse width is established, preferably starting at a minimum width. A value is then scanned into the launching flip-flop of the reference pad and the clock is pulsed. Thereafter, the contents of the reference pad's capture flip-flop is scanned out and a determination is made as to whether the new data has been successfully captured. ATE clock pulse width may be sequentially increased until the new data is successfully received, with the clock pulse width first corresponding to the capture of new data corresponding to the roundtrip time of the reference pad. ATE may then be used to measure components of clock-to-q in set-up time of the reference pad. The aforementioned process of varying the clock pulse width and capturing new data in a capture flip-flop may then be repeated for a pad under test. By utilizing the test circuitry described herein, this pad may be uncontacted by ATE. Once the roundtrip time of the pad under test is determined utilizing the test circuitry, the stored reference value for receiver set-up time may be subtracted from the measured roundtrip time of the pad under test. The resulting value corresponds to the driver clock-to-q time for the pad under test.

It should be noted that the aforementioned method presumes the consistency of receiver set-up time across different pads. Due to the relatively simplistic design and small number of components involved in typical receiver design, this assumption is deemed well-founded. It also should be noted that, based at least in part upon the components utilized, the determination of $T_{SETUP}$ may vary from the methodology employed herein. These various other methods are considered well within the scope of the present invention.

Figure 13:
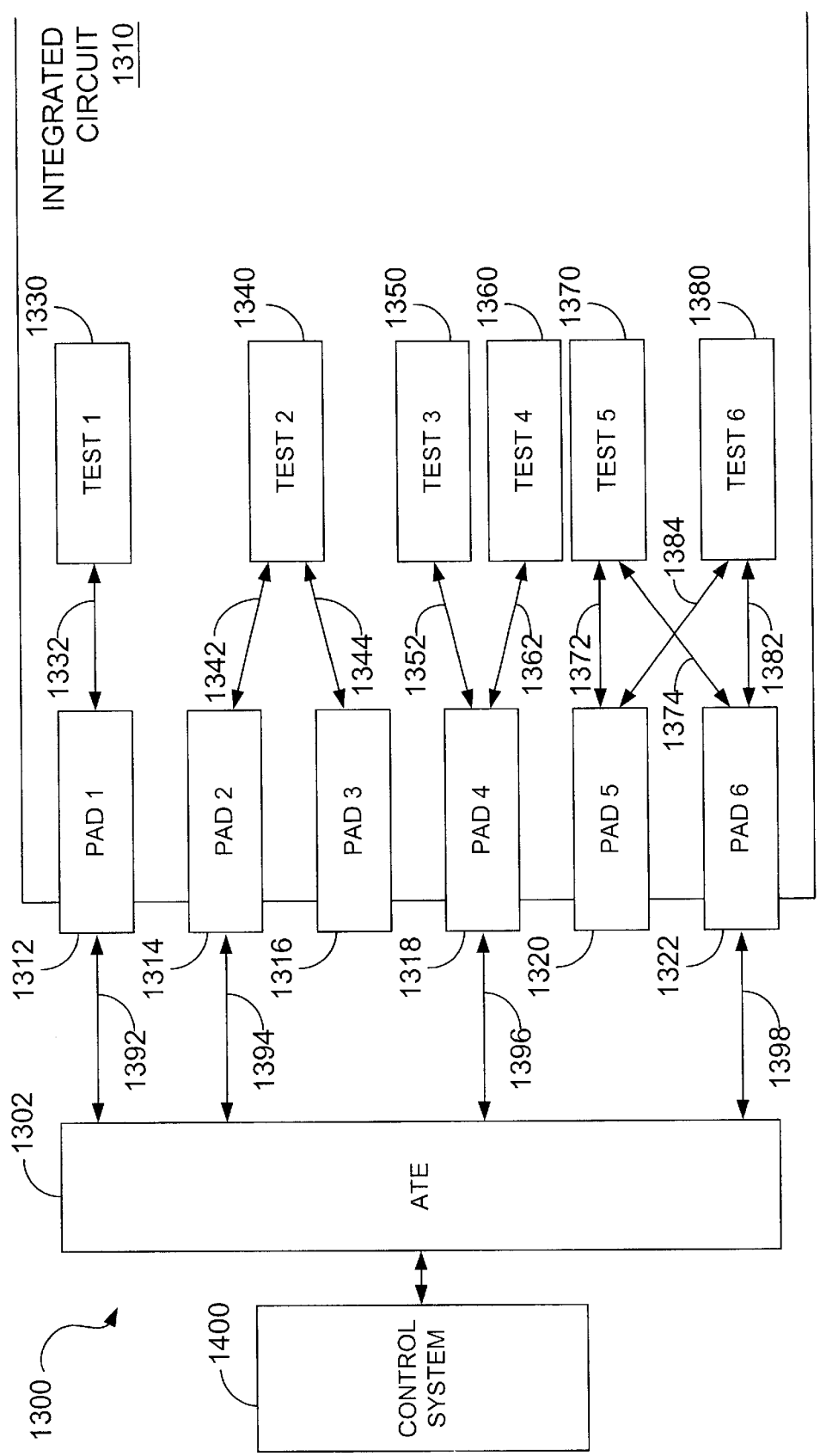
FIG. 13 is a schematic diagram depicting representative test circuit configurations that may be implemented by the present invention.

Referring now to FIG. 13, various aspects of the invention, including test circuitry implementation and calibration will now be described in greater detail. As shown in FIG. 13, a preferred embodiment 1300 of the invention incorporates an integrated circuit 1310 which includes multiple pads. In particular, integrated circuit 1310 includes pads 1 through 6 (1312, 1314, 1316, 1318, 1320 and 1322 respectively). The integrated circuit also incorporates various test circuits, such as Test 1 (1330), Test 2 (1340), Test 3 (1350), Test 4 (1360), Test 5 (1370) and Test 6 (1380). The various test circuits electrically communicate with their respective pads in a variety of configurations. For instance, circuitry 1330 communicates directly with pad 1312 via transmission path 1332 (in a preferred implementation, path 1332 may be two unidirectional paths); circuitry 1340 communicates with each of pads 1314 and 1316 by utilizing transmission paths 1342 and 1344 respectively; circuitry 1350 and circuitry 1360 each electrically communicate with pad 1318 via transmission paths 1352 and 1362 respectively; circuitry 1370 communicates with pads 1320 and 1322 via transmission path 1372 and 1374 respectively; and circuitry 1380 also communicates with pads 1320 and 1322, albeit, via transmission path 1382 and 1384 respectively. Thus, an integrated circuit may incorporate various pad types as well as various configurations of intercommunication between the various pads and various test circuits.

As an illustrative example, and not for the purpose of limitation, an integrated circuit may be configured to utilize one test circuit to test multiple pads, e.g., utilizing one test circuit to test multiple pads of like type. Such a configuration is represented schematically in FIG. 13 by Pad 2 and Pad 3, which are both tested by Test 2.

As shown in FIG. 13, ATE 1302 electrically communicates with the test circuitry of integrated circuit 1310 by utilizing a variety of transmission path configurations. For example, circuitry 1330 communicates with the ATE via transmission path 1332, pad 1312 and transmission path 1392; circuitry 1340 communicates with the ATE via transmission path 1342, pad 1314 and transmission path 1394; circuitry 1350 communicates with the ATE via transmission path 1352, pad 1318 and transmission path 1397; circuitry 1360 communicates with the ATE via transmission path 1362, pad 1318 and transmission path 1396; circuitry 1370 communicates with the ATE via transmission path 1374, pad 1322 and transmission path 1398; and circuitry 1380 communicates with the ATE via transmission path 1382, pad 1322 and transmission path 1398. Additionally, various functionality may be enabled by control system 1400 (described in detail hereinafter).

As described hereinbefore, the present invention is adapted to facilitate automated test equipment functionality for testing integrated circuits. In this regard, some embodiments of the present invention may be construed as providing test systems for testing integrated circuits. More specifically, some embodiments of the test system may include one or more test circuits in combination with ATE, e.g., ATE 1302 of FIG. 13, and a suitable control system, which may be implemented by control system 1400 of FIGS. 13 and 14, for example.

Control system 1400 may be implemented in hardware, software, firmware, or a combination thereof In a preferred embodiment, however, the control system is implemented as a software package, which can be adaptable to run on different platforms and operating systems as shall be described further herein. In particular, a preferred embodiment of the control system, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer readable medium can be, for example, but is not limited to, an electronic, magnetic, optical, electromagnetic, infrared, or semi-conductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Figure 14:
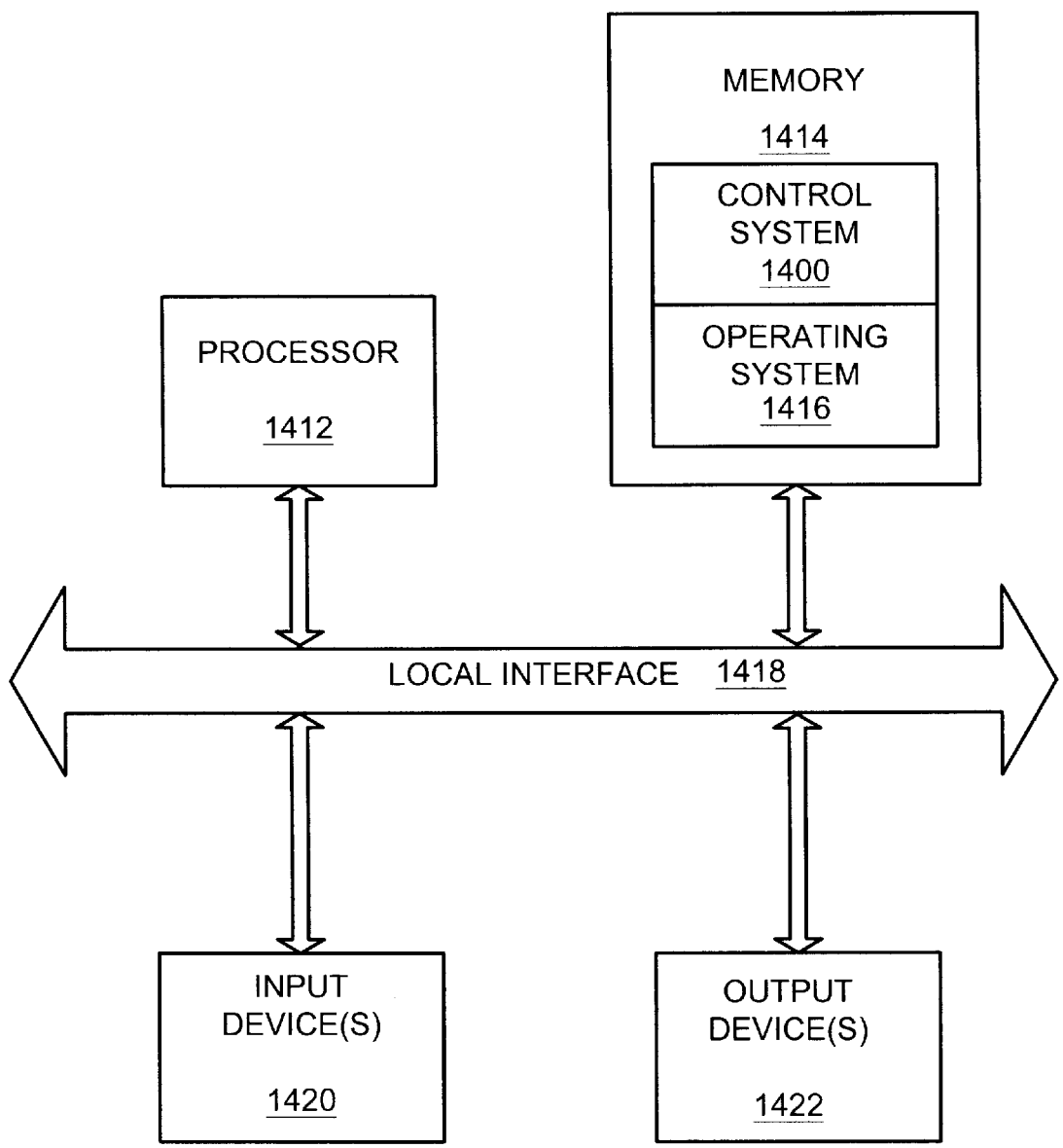
FIG. 14 is a schematic diagram depicting a representative computer or processor-based system that may be utilized as a control system of the present invention.

FIG. 14 illustrates a typical computer or processor-based system which may facilitate functionality of the control system 1400 (described in detail hereinafter) of the present invention. As shown in FIG. 14, the computer system generally comprises a processor 1412 and a memory 1414 with an operating system 1416. Herein, the memory 1014 may be any combination of volatile and nonvolatile memory elements, such as random access memory or read only memory. The processor 1412 accepts instructions and data from memory 1414 over a local interface 1418, such as a bus(es). The system also includes one or more input device (s) 1420 and/or one or more output device(s) 1422. Examples of input devices may include, but are not limited to, a serial port, a scanner, an ATE interface or a local access network connection. Examples of output devices may include, but are not limited to, a video display, a Universal Serial Bus, an ATE interface, or a printer port. Generally, this system may run any of a number of different platforms and operating systems, including, but not limited to, HP-UX™, Linux™, Unix™, Sun Solaris™ or Windows NT™ operating systems. The control system 1400 of the present invention, the functions of which shall be described hereinafter, resides in memory 1414 and is executed by the processor 1412.

Figure 15:
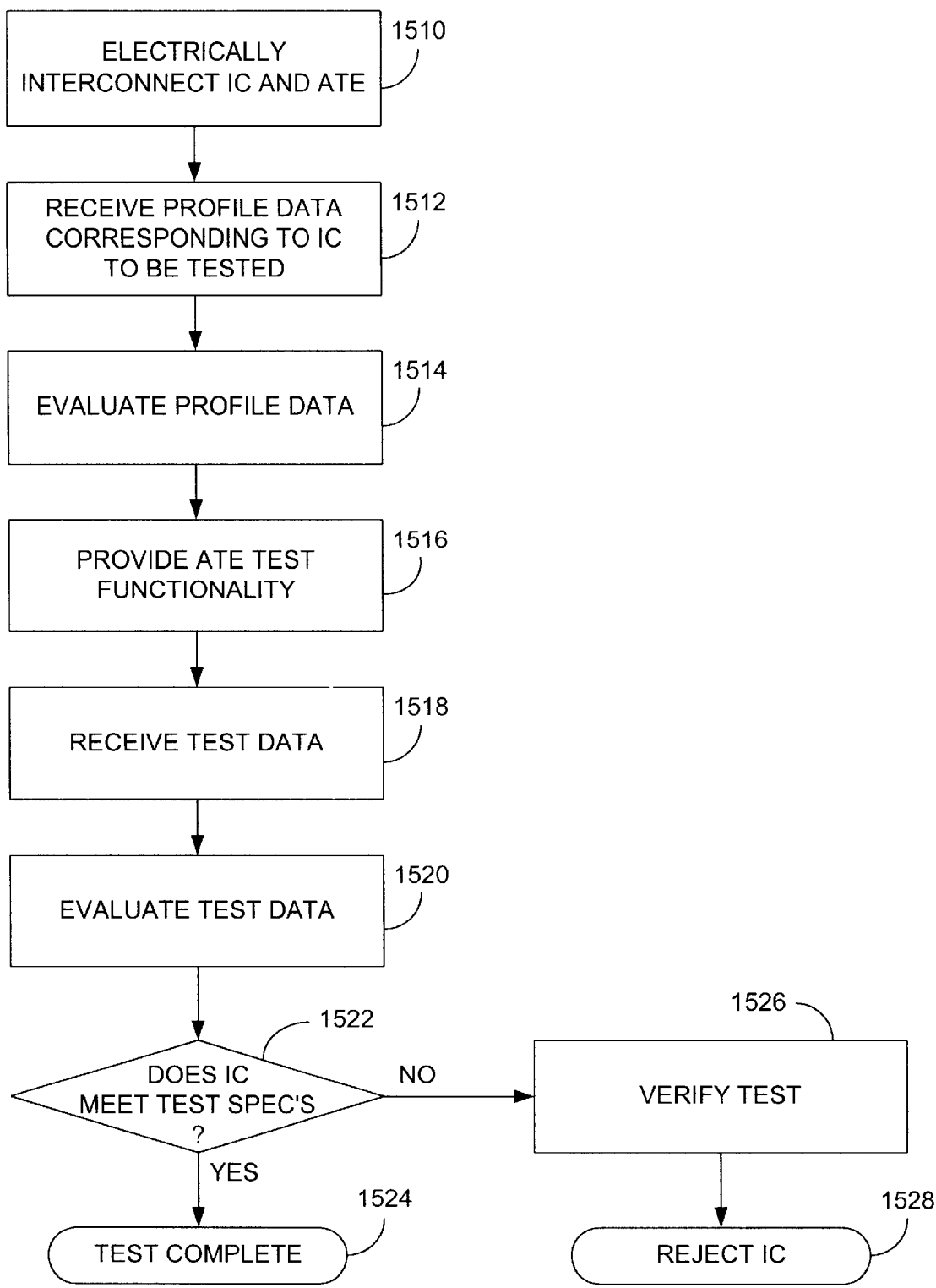
FIG. 15 is a flowchart depicting preferred functionality facilitated by the control system of FIG. 14.

The flowchart of FIG. 15 shows the functionality and operation of a preferred implementation of the control system 1400 depicted in FIG. 14. As depicted in FIG. 15, the control system (or method) may be construed as begining at block 1510 where an IC to be tested is electrically interconnected with ATE. Proceeding to block 1512, profile data corresponding to the IC to be tested may be received. Such profile data may include, but is not limited to, information relating to the type of IC and/or electrical continuity information corresponding to the interconnection of the ATE and the IC, among others. The profile data may be provided in numerous manners, such as by being provided in the form of an operator input at a work station or as a response to a test initiation signal delivered to the analog test circuitry by the ATE, for instance. After receiving the profile data, if applicable, the process preferably proceeds to block 1514 where the data is evaluated, i.e., a determination is made as to whether testing may proceed.

At block 1516, the IC under test is provided, by the ATE, with appropriate signals to facilitate testing. At block 1518, test data is received, such as by the ATE, with the data being received in any suitable manner, e.g., intermittently throughout the testing cycle, or after testing has been completed. At block 1520, where test data is evaluated and, then, in block 1522, a determination may be made as to whether the IC, and its associated components, are functioning as desired. If it is determined that the IC is not functioning as desired, the process may proceed to block 1526 where the test results may be verified, such as by repeating at least some of the aforementioned process steps 1510–1522. Thereafter, if the determination once again is made that the IC is not functioning as desired, the process may proceed to block 1528 where the IC may be rejected. If, however, it is determined that the IC is functioning as desired, the process may proceed to block 1524 where the process may terminate.

As is known, when ATE is used to test an integrated circuit, the ATE should be calibrated to ensure that it is providing accurate measurements. As the present invention provides at least selected ATE functionality, calibration of the test circuitry also should be performed. Typical prior art solutions for addressing the issues of calibration have included: designing test circuitry to be self-calibrating; designing test circuitry to be invariant to process, voltage, and temperature (PVT); and not calibrating the test circuitry at all. In regard to self-calibrating test circuitry, such a technique potentially causes the disadvantage of increasing the size of the test circuitry to a size where use of such circuitry within an integrated circuit is no longer practical. In regard to designing the test circuitry to be invariant to PVT, providing such invariance is effectively not possible. For instance, heretofore, a typical solution has been to make any PVT variance easily characterizable and predictable. Additionally, this technique also may cause the size of the circuitry to increase to a point where its use is no longer practical. In regard to deliberately failing to calibrate test circuitry, obviously, such a technique may result in test circuitry producing inaccurate results which may lead to an increase in the number of improperly functioning integrated circuits being shipped or may cause an increase in the number of properly functioning integrated circuits which are rejected from being shipped.

Figure 16:
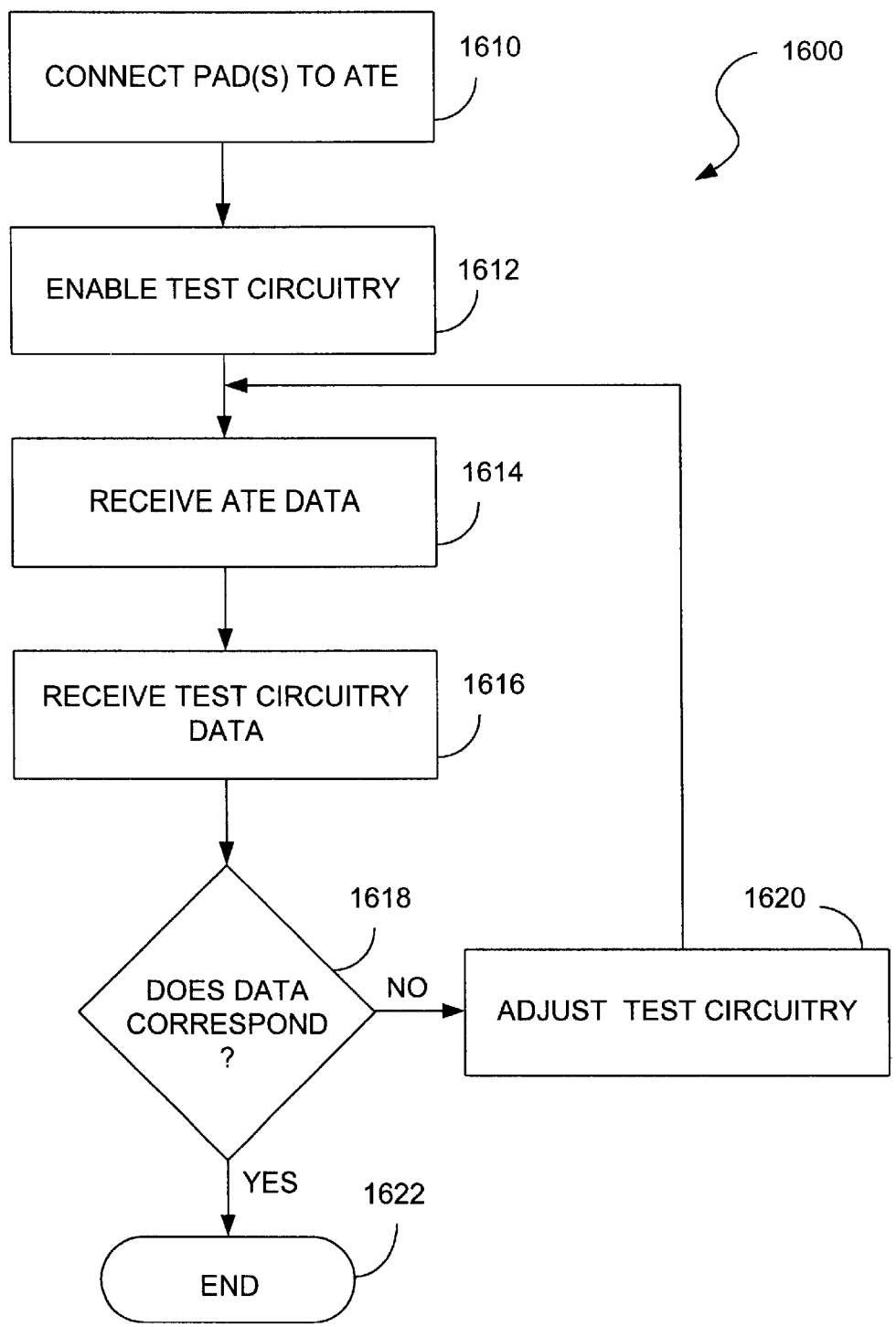
FIG. 16 is a flowchart depicting preferred functionality facilitated by the control system of FIG. 14 during a test circuit calibration procedure.

Since it is preferable to calibrate the test circuitry of the present invention, the following preferred calibration method is provided for the purpose of illustration, and not for the purpose of limitation. As shown in FIG. 16, a preferred method 1600 for calibrating test circuitry preferably begins at block 1610 where designated pads of an integrated circuit to be tested are connected to ATE. Preferably, when a circuit design, e.g., a pad, is used multiple times within an IC, identical test circuitry is associated with each instance of that circuit design. When so configured, connecting of the pads to the ATE, such as depicted in block 1610, preferably includes merely connecting the ATE to one or more instances of the circuit design.

Since different instances of the repeated circuit design are assumed to be identical in their defect-free electrical behavior, measurements made on the ATE-connected instance of the circuit design may be assumed to correlate to the measurements made at other instances of that circuit design. It should be noted, however, that since each identical instance of the block is assumed to have identical defect-free electrical behavior, only one non-connective pad of each pad type need be utilized, although additional ones of the pads may be utilized for added error detection and comparison.

Proceeding to block 1612, test circuitry is enabled. With both ATE and the appropriate test circuitry now enabled, measurements may be taken by either or both of the ATE and the test circuitry. Thus, as depicted in blocks 1614 and 1616, the process includes the steps of receiving ATE measurements and receiving test circuitry measurements, respectively. At block 1618, a determination may be made as to whether the ATE measurement data and the 6 test circuitry data appropriately correspond, thereby indicating proper calibration of the test circuitry. If, however, it is determined that the measurements do not correspond, the process may proceed to block 1620 where the test circuitry measurements may be adjusted to match those measurements obtained from the ATE. Thereafter, the process may proceed back to block 1614 and proceed as described hereinbefore until the test circuitry measurements are appropriately calibrated. Once appropriate calibration has been achieved, the process may end, such as depicted in block 1622.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A method for testing an integrated circuit (IC), the IC having a first pad configured as a signal interface for components external to the IC, the first pad having a receiver configured to receive a signal from a component external to the IC and to provide a digital signal in response thereto, said method comprising:

electrically interconnecting automated test equipment (ATE) with the IC;

providing at least one stimulus such that the IC measures driver clock-to-q time of the first pad; and receiving information corresponding to the driver clock-to-g time of the first pad;

wherein providing at least one stimulus comprises:
      enabling a timer of the IC to provide an output signal to the driver of the first pad;
      enabling the timer to receive a driver output corresponding to the output signal; and
      determining an interval between providing the output signal to the driver and receiving the driver output.

2. The method of claim 1, wherein providing at least one stimulus comprises:

providing the at least one stimulus from the ATE.

3. The method of claim 1, wherein providing at least one stimulus comprises:

enabling a first flip-flop of the IC to provide an output signal to the driver of the first pad; and evaluating an output of a receiver of the first pad corresponding to the output signal of the first flip-flop.

4. The method of claim 1, wherein the IC has a plurality of pads, and wherein electrically interconnecting automated test equipment (ATE) with the IC comprises electrically interconnecting the ATE to a subset of the plurality of pads such that information corresponding to the driver clock-to-q times of more than the subset of pads can be determined.

5. The method of claim 1, wherein providing at least one stimulus additionally comprises:

determining a roundtrip time of the first pad;

determining a receiver setup time of the first receiver of the first pad; and evaluating the roundtrip time and the receiver setup time to determine the driver clock-to-q time.

6. The method of claim 1, wherein determining an interval between providing the output signal to the driver and receiving the driver output further comprises:

comparing the interval to a known interval such that actual driver clock-to-q time can be determined.

7. The method of claim 6, wherein the known interval is a clock cycle of the IC.

8. A method for testing an integrated circuit (IC), the IC having a first pad configured as a signal interface for components external to the IC, the first pad having a receiver configured to receive a signal from a component external to the IC and to provide a digital signal in response thereto, said method comprising:

electrically interconnecting automated test equipment (ATE) with the IC;

providing at least one stimulus such that the IC measures driver clock-to-q time of the first pad; and receiving information corresponding to the driver clock-to-q time of the first pad;

wherein providing at least one stimulus comprises:

enabling a first flip-flop of the IC to provide an output signal to the driver of the first pad; and evaluating an output of a receiver of the first pad corresponding to the output signal of the first flip-flop; and wherein enabling a first flip-flop of the IC to provide an output signal to the driver of the first pad comprises:

providing a first clock signal to the first flip-flop;

inverting the data output of the first flip-flop in response to the first clock signal; and providing the data output of the first flip-flop to the driver.

9. The method of claim 8, wherein providing at least stimulus comprises:

providing the at least one stimulus from the ATE.

10. The method of claim 8, wherein the IC has a plurality of pads, and wherein electrically interconnecting the ATE with the IC comprises electrically interconnecting the ATE to a subset of the plurality of pads such that information corresponding to the driver-to-q times of more than the subset of pads can be determined.

* * * * *